United States Patent
Kubota et al.

(10) Patent No.: US 6,877,408 B2
(45) Date of Patent: Apr. 12, 2005

(54) PRESS PUNCHING METHOD AND APPARATUS FOR FORMING A PLURALITY OF THROUGH HOLES BY CHANGING A TRAVEL DISTANCE OF A PUNCHING MOLD

(75) Inventors: Akihiro Kubota, Shibata (JP); Shuji Mori, Shibata (JP); Masamichi Fujimoto, Shibata (JP)

(73) Assignee: Fujitsu Limited, Kawasaki (JP)

( * ) Notice: Subject to any disclaimer, the term of this patent is extended or adjusted under 35 U.S.C. 154(b) by 205 days.

(21) Appl. No.: 09/793,766

(22) Filed: Feb. 27, 2001

(65) Prior Publication Data

US 2002/0002887 A1 Jan. 10, 2002

(30) Foreign Application Priority Data

Jul. 7, 2000 (JP) ........................................ 2000-207450

(51) Int. Cl.[7] .................................................. B26D 7/26
(52) U.S. Cl. ................................ 83/35; 83/39; 83/76.7; 83/248; 83/530; 83/550
(58) Field of Search ............................ 234/1–3, 94, 95; 83/213, 240, 248, 527, 530, 622, 688, 691, 550, 551, 39, 682, 255, 620, 35, 73, 76.7, 76.9, 368, 553, 358, 359

(56) References Cited

U.S. PATENT DOCUMENTS

| | | | |
|---|---|---|---|
| 530,560 A | * 12/1894 | Swaney | 83/468.3 |
| 804,108 A | * 11/1905 | Evans | 83/622 |
| 849,312 A | * 4/1907 | Barnes | 30/363 |
| 1,003,993 A | * 9/1911 | Day | 234/45 |
| 1,380,542 A | * 6/1921 | Drewes | 83/528 |
| 3,194,099 A | * 7/1965 | Palter | 83/156 |
| 3,232,156 A | * 2/1966 | Fuller | 83/39 |
| 3,608,413 A | * 9/1971 | Borello | 83/133 |
| 3,780,939 A | * 12/1973 | Woodie | 234/115 |
| 3,866,254 A | * 2/1975 | Gronda | 412/40 |
| 4,104,942 A | * 8/1978 | Leloux | 83/327 |
| 4,898,056 A | * 2/1990 | Grobb et al. | 83/689 |
| 4,970,926 A | * 11/1990 | Ghajar et al. | 83/468.94 |
| 5,740,712 A | * 4/1998 | Watkins et al. | 83/549 |
| 5,776,579 A | * 7/1998 | Jessup et al. | 428/73 |
| 6,634,271 B1 | * 10/2003 | Dal Ceredo | 83/620 |

FOREIGN PATENT DOCUMENTS

SU 712644 * 1/1980 ................. 83/622

* cited by examiner

Primary Examiner—Stephen Choi
(74) Attorney, Agent, or Firm—Armstrong, Kratz, Quintos, Hanson & Brooks, LLP

(57) ABSTRACT

A press punching apparatus makes many holes at the same time and changes an arrangement of the holes without changing a punch block and a die block. A punching mold is provided with a plurality of punches having different lengths. A travel distance of the mold is adjusted so that a first part of the punches penetrates a work piece to be punched in a first stroke. Then, the travel distance of the mold is changed so that the work piece is punched by a second part of the punches other than the first part of the punches in a second stroke.

4 Claims, 9 Drawing Sheets

PROCESS COMBINATION ( STAGGERED ARRANGEMENT )

FIG. 13

PROCESS COMBINATION (HALF PITCH ARRANGEMENT )

PRESS PUNCHING METHOD AND APPARATUS FOR FORMING A PLURALITY OF THROUGH HOLES BY CHANGING A TRAVEL DISTANCE OF A PUNCHING MOLD

BACKGROUND OF THE INVENTION

1. Field of the Invention

The present invention relates to a press punching technique and, more particularly, to a press punching method and apparatus suitable for manufacturing a substrate of a semiconductor device.

2. Description of the Related Art

In recent years, there is a demand for high density mounting of semiconductor devices. In order to satisfy such a demand, BGA/LGA (ball grid array package/land grid array package) or CSP (chip size package or chip scale package) is used as a package of a semiconductor device. In the BGA and CSP, electrodes for providing external connection terminals can be arranged in even a semiconductor mounting area, thereby reducing a mounting area of a semiconductor chip such as an IC chip to the size of the semiconductor chip.

In the BGA or CSP, a semiconductor chip is mounted on a wiring board, and external connection terminals are provided on an opposite surface of the wiring board. In such a structure, generally, a small through hole is formed in the wiring board at a position where a land is formed on which each external connection terminal is provided. Accordingly, many through holes are formed in the wiring board in the same arrangement as that of the lands.

Figure 1:
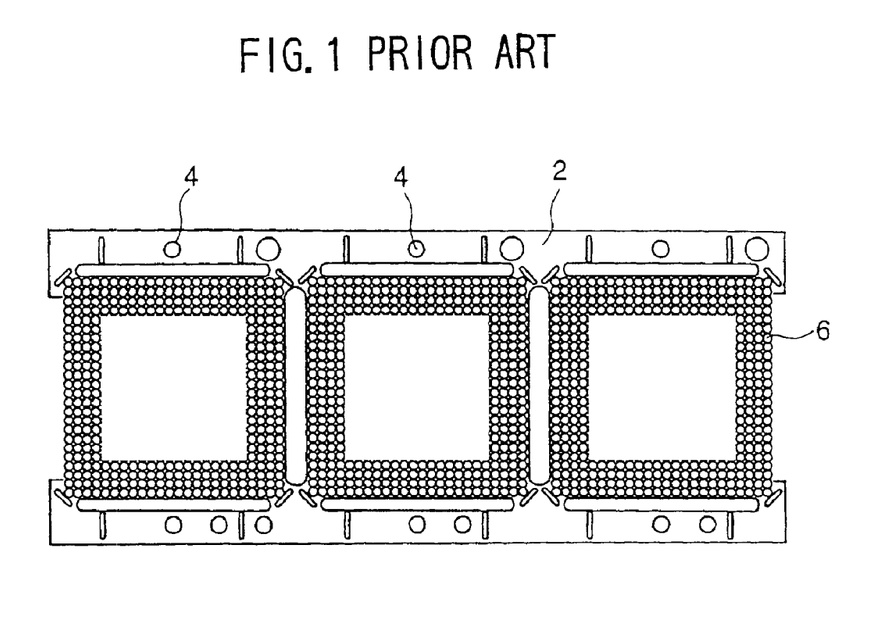
FIG. 1 is a plan view of a substrate of a BGA type semiconductor device.

FIG. 1 is a plan view of a substrate (wiring board) of a BGA type semiconductor device. The BGA wiring board shown in FIG. 1 is formed by applying copper foil to a tape-like substrate material 2 and patterning the copper foil by etching. The tape-like substrate material 2 is previously provided with guide holes 4 so that the guide holes 4 are used for positioning the substrate material 2. Generally, the BGA wiring board has a multi-layered structure, and electrical connection between the layers in a perpendicular direction is achieved by using the through holes formed in each layer. Additionally, many wirings and lands 6 are formed in the wiring board 2, and the above-mentioned through hole is previously formed under each land 6. Accordingly, the through holes must be provided in the same arrangement as that of the lands 6.

Figure 2:
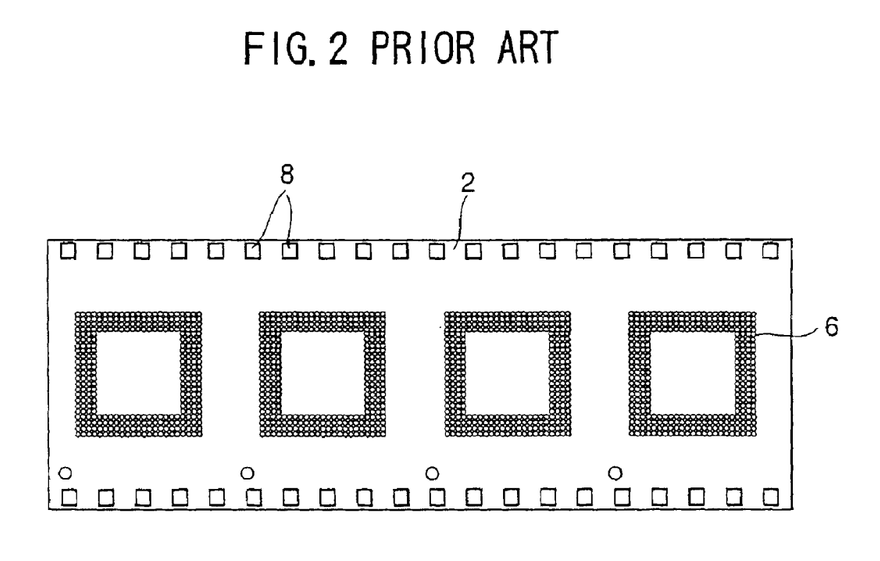
FIG. 2 is a plan view of a substrate of a CSP type semiconductor device.

FIG. 2 is a plan view of a substrate (wiring board) of a CSP type semiconductor device. The CSP wiring board shown in FIG. 2 is generally referred to as an interposer, and is formed in the same manner as that of the BGA wiring board. The tape-like substrate material 2 is previously provided with sprocket holes 8 so that the sprocket holes 8 are used for positioning the substrate material 2. Additionally, many wirings and lands 6 are formed in the wiring board 2, and the above-mentioned through hole is previously formed under each land 6. Accordingly, the through holes must be provided in the same arrangement as that of the lands 6.

The above-mentioned through holes can be formed by drilling by a small diameter drill, laser machining or press punching. The press punching is generally used since the machining cost of the press punching is lower than that of the drilling or laser machining.

When the drilling or laser machining is used, it is difficult to make many holes at the same time. Accordingly, the through holes are formed on an individual hole basis. On the other hand, the press punching can form many through holes by a single press stroke by arranging many punches in the same arrangement as that of the through holes to be formed. Accordingly, the press machining has a short machining time, and, thus, there is an advantage that a low machining cost can be achieved.

In recent years, the number of kinds of semiconductor devices is increased, and, thus, a service time of one kind of semiconductor device has been shortened. This means that a usable time of punches and dies, which are fabricated in accordance with the electrode arrangement of one kind of semiconductor device, is shortened. In such circumstances, if the punch and die for press punching are produced based on an electrode arrangement of a single kind of semiconductor device, a ratio of the cost of producing the punch and die to the manufacturing cost of the semiconductor device is increased. Thereby, there is a problem in that the manufacturing cost of each semiconductor device is increased.

If a single punch is used for making many holes on an individual hole basis by moving the punch, the positions of the holes can be changed by changing the movement of the wiring board according to numerical control (NC). However, this rendered the machining time to be as long as the drilling or laser machining. Accordingly, the advantage that many holes can be made at the same time is lost.

SUMMARY OF THE INVENTION

It is a general object of the present invention to provide an improved and useful press punching method and apparatus in which the above-mentioned problems are eliminated.

A more specific object of the present invention is to provide a press punching method and apparatus which can make many holes at the same time and can change an arrangement of the holes without changing a punch block and a die block.

In order to achieve the above-mentioned objects, there is provided according to one aspect of the present invention a press punching method comprising the steps of:

adjusting a travel distance of a mold provided with a plurality of punches having different lengths so that a first part of the punches penetrates a work piece to be punched in a single stroke; and changing the travel distance of the mold in a different stroke so that a second part of the punches other than the first part of the punches penetrates the work piece to be punched.

According to the present invention, the work piece can be punched by the punches having the longest length in the first stroke. Then, the work piece is punched by the punches having the longest and second longest punches. In this manner, the punches actually used can be selected by changing the travel of the punches. That is, an arrangement of the punched through holes can be changed by changing the travel of the mold by using the punches having different lengths. Thus, there is no need to replace the entire mold including the punches and dies when an arrangement of through holes formed in a substrate material (work piece) of a semiconductor device must be changed. Thereby, an investment in manufacturing a semiconductor device can be reduced, and an initial manufacturing period of a semiconductor device can be reduced.

The press punching method may further comprise the step of moving the work piece by a predetermined distance in synchronization with the stroke of the mold so as to achieve a desired arrangement by varying the arrangement of the through holes in a two-dimensional manner.

In the press punching method according to the present invention, the punches may be aligned with at least one line, and the step of moving may include moving the work piece in a direction perpendicular to an extending direction of the at least one line.

Additionally, there is provided according to another aspect of the present invention a press punching method for forming a plurality of through holes in a sheet-like work piece to be punched, the press punching method comprising the steps of:

placing the work piece between a die block and at least one punch block having a plurality of punches arranged along a line, distances between the ends of the punches and the die block being different from each other;

forming at least one first through hole in the work piece by punching the work piece by a part of the punches by moving at least one of the die block and the punch block until a first predetermined distance is formed therebetween;

moving the work piece by a second predetermined distance after disengaging the part of the punches from the work piece by separating the die block and the punch block from each other; and forming at least one second through hole in the work piece by punching the work piece by a part of the punches by moving at least one of the die block and the punch block until a third predetermined distance different from the first predetermined distance is formed therebetween.

A plurality of punch blocks may be provided so as to punch the work piece.

Additionally, there is provided according to another aspect of the present invention a press punching apparatus comprising:

a punching mold including at least one punch block and a die block, the punch block having a plurality of punches arranged along a line and having different lengths, the die block receives the punches of said punch block;

a driving mechanism which moves at least one of the punch block and the die block so as to open and close the punching mold; and an adjusting mechanism which controls a distance between the punch block and the die block when the punching mold is closed by adjusting a stroke of the punching mold.

The press punching apparatus according to the present invention may further comprise a moving mechanism which moves a work piece to be punched at every individual stroke of the punching mold.

Additionally, the press punching apparatus according to the present invention may further comprise a press plate situated between the punch block and the die block, the press plate being mounted to the punch block via an elastic member so that the work piece is sandwiched between the die block and the press plated and is held therebetween by a pressing force exerted by the elastic member when the punching mold is closed.

The punches may be provided to the punch block in a line arrangement, and the moving mechanism may move the work piece in a direction perpendicular to a line along which the punches are arranged. The driving mechanism may comprise a linear motor. The punching mold may be mounted to a pair of platens, one of the platens being slidable along a column fixed on the other one of the platens, the linear motor being provided between the column and the one of the platens. The punching mold may be provided with a plurality of punch blocks.

Other objects, features and advantages of the present invention will become more apparent from the following detailed description when read in conjunction with the accompanying drawings.

DETAILED DESCRIPTION OF THE PREFERRED EMBODIMENT

A description will now be given of an embodiment of the present invention.

Figure 3:
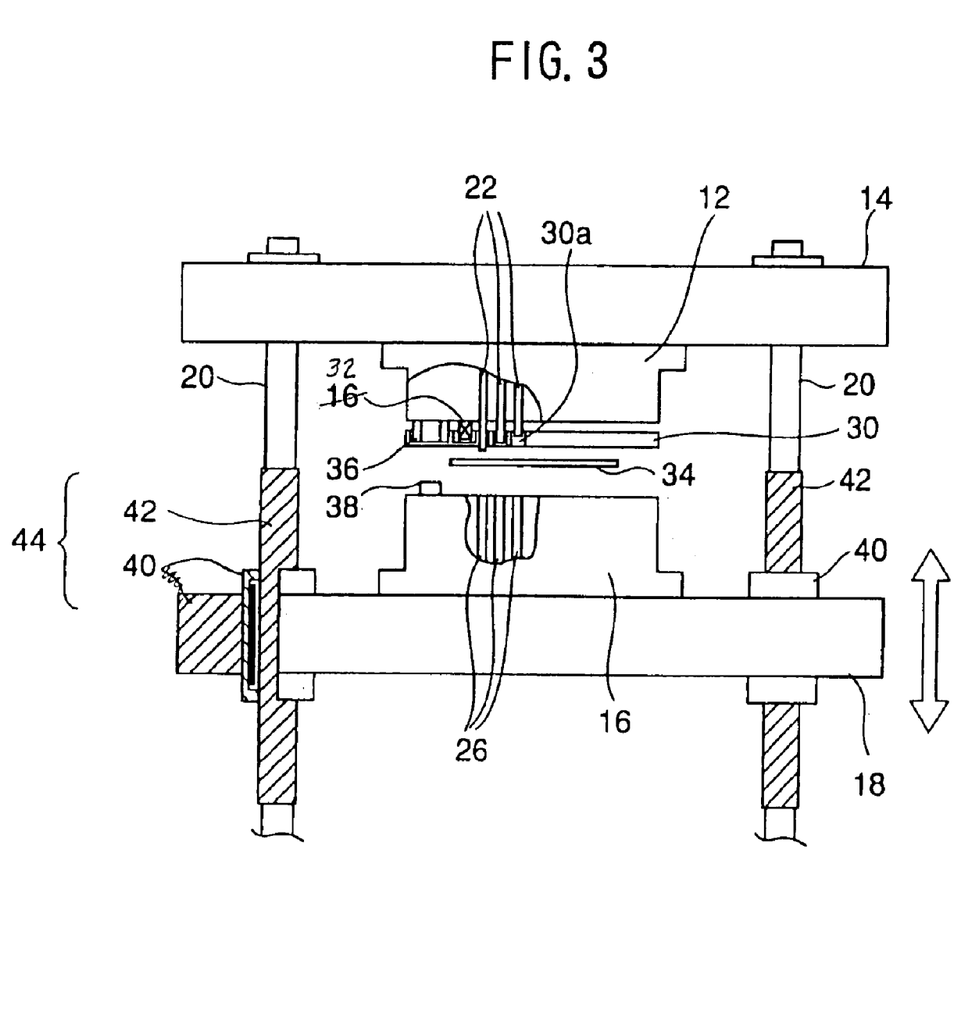
FIG. 3 is a side view of a press punching apparatus according to a first embodiment of the present invention.

FIG. 3 is a side view of a press punching apparatus according to the embodiment of the present invention. The press punching apparatus shown in FIG. 3 has an upper platen 14 on which an upper mold 12 is mounted and a lower platen 18 on which a lower mold 16 is mounted. A pair of sliders (columns) 20 are fixed on opposite ends of the upper platen 14 so that the lower platen 18 is slidable along the sliders 20. A lower end of each of the sliders 20 is fixed to a base (not shown in the figure).

The upper mold 12 serves as a punch block provided with a plurality of punches 22. The lower mold 16 serves as a die block provided with a plurality of die holes 26 corresponding to the punches 22. Additionally, a press plate 30 is mounted to the upper mold 12 via an elastic member such as a spring 32. The press plate 30 is provided with a plurality of through holes 30a at positions corresponding to the punches 22 so that the punches 22 can enter the die block by being passed through the respective through holes of the press plate 30.

A substrate material 34, which is a work piece to be punched, is a tape-like substrate material such as a polyimide tape. It is preferable that a plurality of the substrate material 34 can be consecutively punched. The substrate material 34 is placed between the press plate 30 and the lower mold 16. The substrate material 34 is clamped by the press plate 30 and the lower mold 16 when the lower mold 16 is moved upward as mentioned later. Since the press plate 30 is mounted to the upper mold 12 (punch block), the substrate material 34 can be clamped between the press plate 30 and the lower mold 16 with an appropriate pressing force even if a distance between the upper mold 12 and the lower mold 16 when the mold is closed is changed. It should be noted that the substrate material 34 is moved in synchronization with the stroke of the lower mold 16. The moving mechanism of the substrate material 34 can be constituted by a linear feeder or the like, which is not shown in the figure. The direction of movement of the substrate material 34 is perpendicular to the plane of FIG. 3.

It should be noted that the uppermold 12 is provided with a guide member 36, and the lower mold 16 is provided with a protruding member 38. The protruding member 38 fits in a concave portion of the guide member 36 when the mold comprised of the upper mold 12 and the lower mold 16 is closed. Thereby, the upper mold 12 and the lower mold 16 can be accurately positioned to each other when the mold is closed.

Sliding portions of the lower platen 18 with the sliders 20 constitute linear motor 44 comprised of a movable armature 40 and a stator 42. The linear motor 44 is controlled by a control mechanism shown in FIG. 4, and capable of generating an accurate driving force. The lower platen 18 can be moved by the linear motor with high accuracy.

Figure 4:
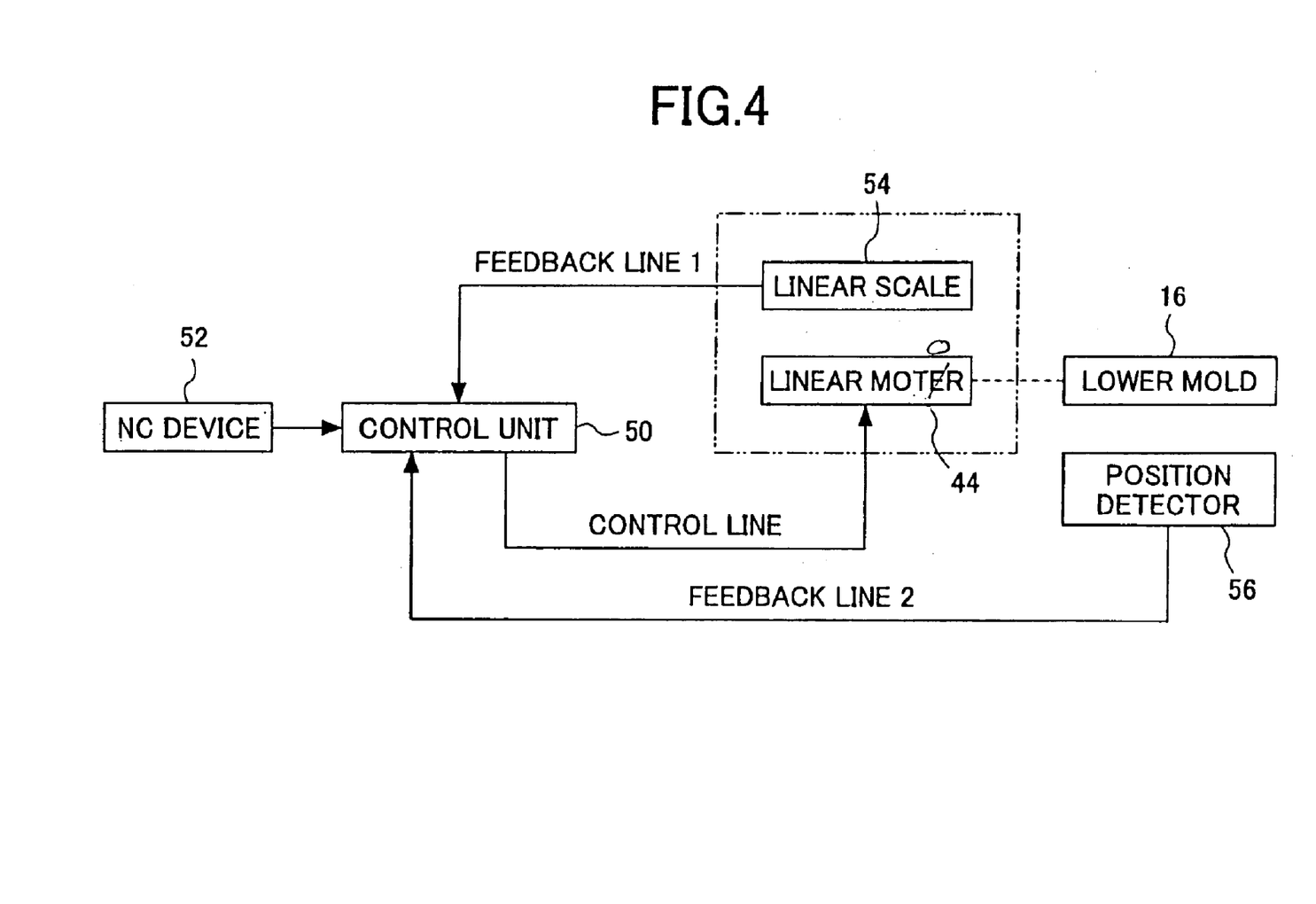
FIG. 4 is a block diagram of a control mechanism which controls an operation of a linear motor shown in FIG. 3.

FIG. 4 is a block diagram of the control mechanism, which controls an operation of the linear motor 44. The control mechanism shown in FIG. 4 comprises: a control unit 50 which generates a drive force by supplying an electric power to the linear motor 44; an NC device 52 which controls the moving mechanism of the substrate material 34 according to a numerical control; a linear scale 54 which indicates a position of the movable armature; and a position detector 56 which detects a position of the lower mold 16.

The linear scale 54 outputs position information of the movable armature 40 of the linear motor 44, and the position information is supplied to the control unit 50 via a feedback line 1. Additionally, the position detector 56 outputs position information of the lower mold 16, and the position information is supplied to the control unit 50 via a feedback line 2. The control unit 50 determines an electric signal to be supplied to the liner motor 44 based on the position information of the linear scale 54 and the position information of the position detector 56, and supplies the electric signal to the linear motor via a control line.

Additionally, a numerical control signal, which numerically controls a position of the substrate material 34 to be punched, is supplied from the NC device 52 to the control unit 50. Thus, the control unit 50 can drive the linear motor 44 in synchronization with the numerical control signal. Accordingly, for example, an upper limit position of the movable armature of the linear motor 44 can be changed for each stroke of the lower mold 16. That is, the distance between the lower mold 16 and the upper mold 12 when the mold is closed can be changed for each stroke of the mold.

Figure 5:
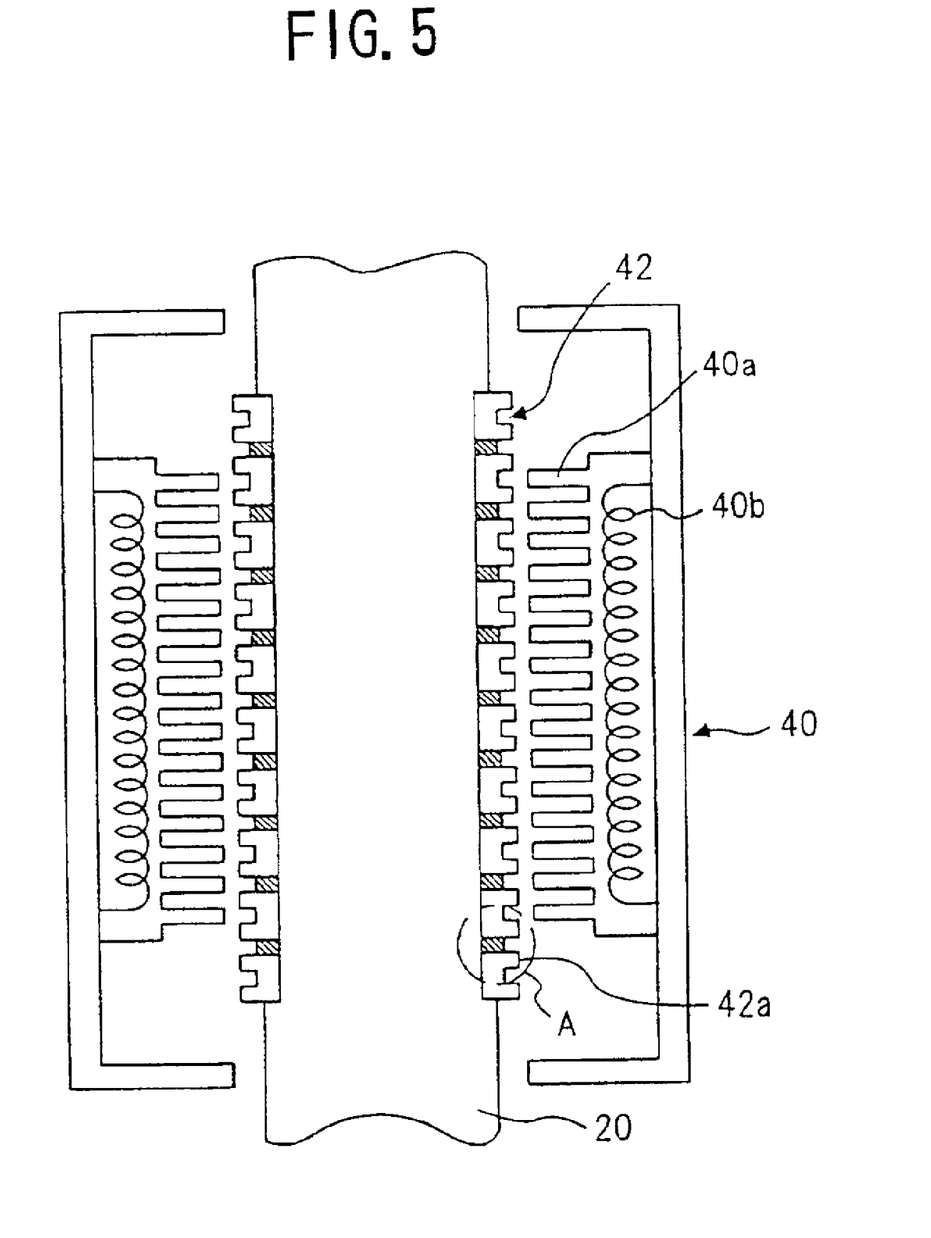
FIG. 5 is an enlarged cross-sectional view of the linear motor.

FIG. 5 is an enlarged cross-sectional view of the linear motor 44. As mentioned above, the linear motor 44 comprises the movable armature 40 provided with an electromagnetic coil and the stator 42 provided with a permanent magnet. In a conventional linear motor, the stator has an electromagnetic coil and the movable armature has a permanent magnets. However, since the electromagnetic coil moves relative to the permanent magnet in the apparatus according to the first embodiment of the present invention, a part provided with the electromagnetic coil is referred to as the movable armature and a part provided with the permanent magnets is referred to as the stator.

The stator 42 is mounted on the periphery of each of the sliders 20, and has a predetermined length in a direction of the longitudinal axis of each of the sliders 20 so that the movable armature 40 is movable by the length of the stator 42. That is, the lower platen 18 (lower mold 16) is movable by a length corresponding to the length of the stator 42. However, the movable armature 40 can be stopped at an arbitrary position along the stator 42 by the control of the above-mentioned control unit 50.

Figure 6:
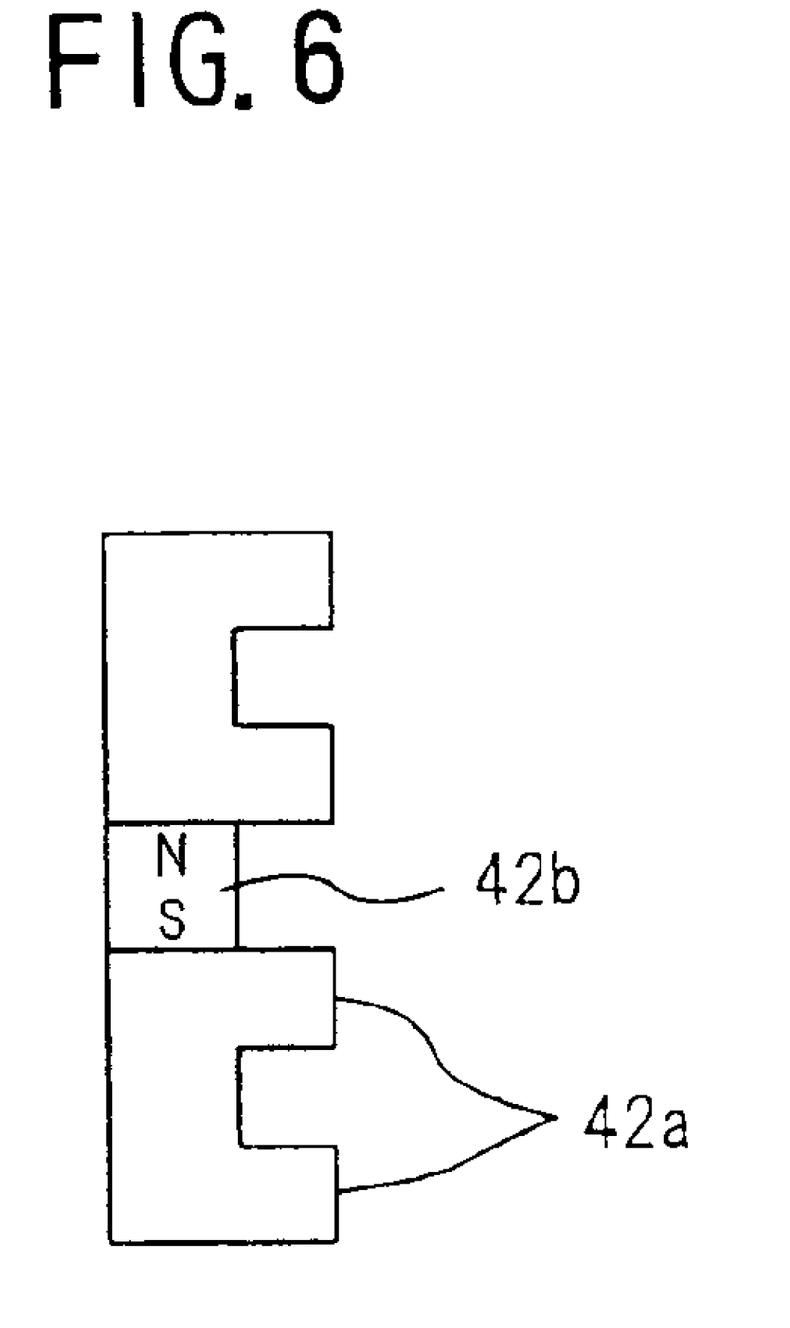
FIG. 6 is an enlarged view of a part A of FIG. 5.

The movable armature 40 has a plurality of teeth 40a, which face teeth 42a of the stator 42 with a predetermined small distance therebetween. Each of the teeth 40a of the movable armature 40 is provided with an electromagnetic coil 40b so that each of the teeth 40a is magnetized by an electric current flowing through the electromagnetic coil 40b. It should be noted that although the electromagnetic coil 40b is indicated as a single coil in FIG. 5, the electromagnetic coil 40b is actually provided to each of the teeth 40a. On the other hand, as shown in FIG. 6, a permanent magnet 42b is provided between the teeth 42a so as to form predetermined magnetic fields together with the teeth 42a along the longitudinal axis of the slider 20. It should be noted that FIG. 6 is an enlarged view of a part A of FIG. 5.

In the above-mentioned structure, the movable armature 40 can be moved along the stator 42 by supplying an electric current to the electromagnetic coil 40b and changing the direction of the current so as to appropriately change the polarity of the magnetic field generated by the electromagnetic coil 40b. The principle of the driving mechanism of the linear motor is well known in the art, and a description thereof will be omitted.

As shown in FIG. 3, the press punching apparatus according to the present embodiment is provided with a plurality of punches 22 having different lengths by being arranged in a direction perpendicular to the direction of movement of the substrate material 34. The number of punching positions in the substrate material 34 can be varied by changing the uppermost position of the lower mold 16.

Figure 7A:
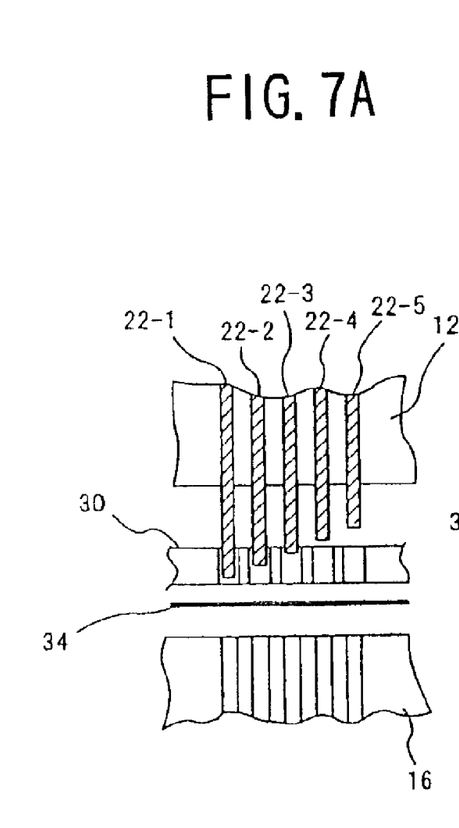
FIGS. 7A through 7D are illustrations of processes of punching a substrate material.
Figure 7B:
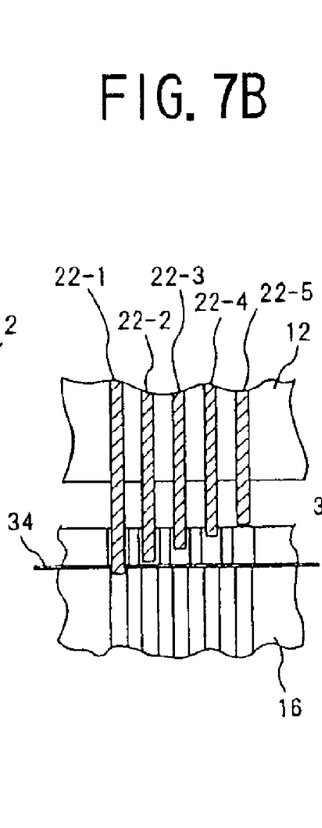
Figure 7C:
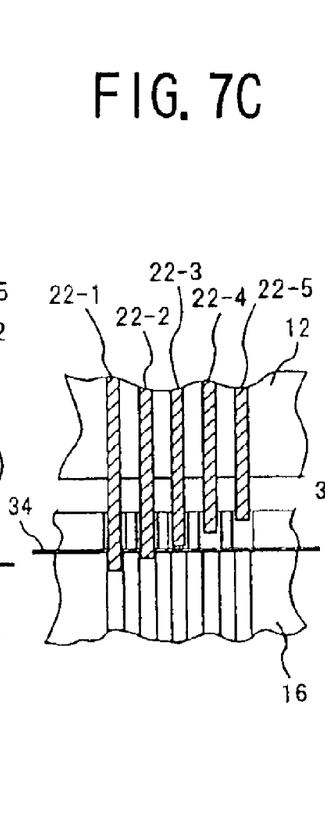
Figure 7D:
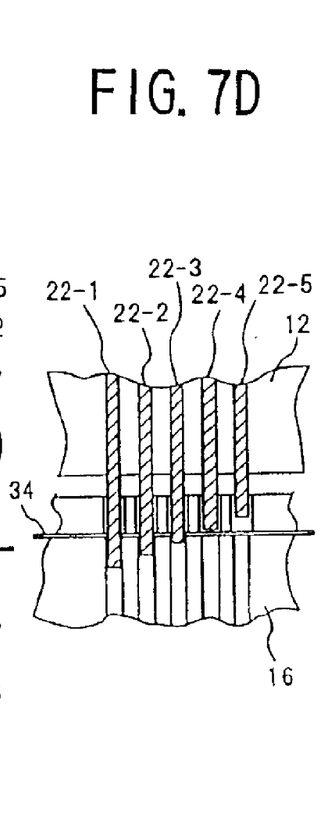

A description will now be given, with reference to FIGS. 7A, 7B, 7C and 7D, of an operation of the above-mentioned press punching apparatus. FIGS. 7A through 7D are illustrations of processes of punching the substrate material 34 by the punches 22. FIG. 7A shows a state in which the substrate material 34 is not punched. FIG. 7B shows a state in which the substrate material 34 is punched only by a first one of the punches 22. FIG. 7C shows a state in which the substrate material 34 is punched by the first one and a second one of the punches 22. FIG. 7D shows a state in which the substrate material 34 is punched by the first one, the second one and a third one of the punches 22.

In the example of FIGS. 7A through 7D, five punches 22-1 through 22-5 are provided. However, the number of punches is not limited to five, and an arbitrary number of punches may be provided in response to the number of through hole to be made in the substrate. It is preferable that the number of punches corresponds to the number of through holes arranged in one row in the substrate material. If the number of punches is equal to the number of through holes arranged in one row, the through holes arranged in one row can be punched by a single stroke of the mold. Accordingly, all through holes provided in a single semiconductor device can be formed by vertically reciprocating the lower mold 16 while stepwisely moving the substrate material 34 by a pitch of the rows of the through holes, the number of strokes of the lower mold 16 being equal to the umber of rows of the through holes provided in a single semiconductor device.

FIG. 7A shows a state before the substrate material 34 is punched. In FIG. 7A, the lower mold 16 is at a lowermost position. In this state, the substrate material 34 is positioned between the lower mold 16 and the press plate 30.

When the lower mold 16 is moved upwardly to a position indicated in FIG. 7B, the substrate material 34 is first sandwiched between the lower mold 16 and the press plate 30 and an appropriate holding force is applied to the substrate material 34, and, then, the substrate material 34 is punched by the first punch 22-1. If the upward movement of the lower mold 16 is stopped at this position and is moved downward, a through hole is formed in the substrate material 34 at a position corresponding to the punch 22-1.

If the lower mold 16 is moved by the operation of the linear motor 44 to a position shown in FIG. 7C, the substrate material 34 is first sandwiched between the lower mold 16 and the press plate 30 and an appropriate holding force is applied to the substrate material 34, and, then, the substrate material 34 is punched by the first punch 22-1. Thereafter, the lower mold 16 is further moved upward, and, thereby, the substrate material 34 is punched by the second punch 22-2. If the upward movement of the lower mold 16 is stopped at this position and is moved downward, through holes are formed in the substrate material 34 at positions corresponding to the punches 22-1 and 22-2.

If the lower mold 16 is moved by the operation of the linear motor 44 to a position shown in FIG. 7D, the substrate material 34 is first sandwiched between the lower mold 16 and the press plate 30 and an appropriate holding force is applied to the substrate material 34, and, then, the substrate material 34 is punched by the first punch 22-1. Thereafter, the lower mold 16 is further moved upward, and, thereby, the substrate material 34 is punched by the second punch 22-2. Since the lower mold 16 is further moved upward, the substrate material 34 is also punched by the third punch 22-3. If the upward movement of the lower mold 16 is stopped at this position and is moved downward, through holes are formed in the substrate material 34 at positions corresponding to the punches 22-1, 22-2 and 22-3.

Similarly, if the lower mold 16 is moved upward to a position where the substrate material 34 reaches the punch 22-5, through holes are formed in the substrate material 34 at positions corresponding to all of the punches 22-1 to 22-5.

As mentioned above, the punching can be performed only by the punches having lengths which can reach the substrate material 34 by varying the uppermost position of the lower mold 16, and the punching is not performed by the punches which do not have sufficient lengths to reach the substrate material 34. In the present embodiment, the change in the stroke (uppermost position) of the mold is achieved by the linear motor 44 in an easy and accurate manner.

A description will now be given of examples of the punching performed by the press punching apparatus according to the present embodiment.

Figure 8:
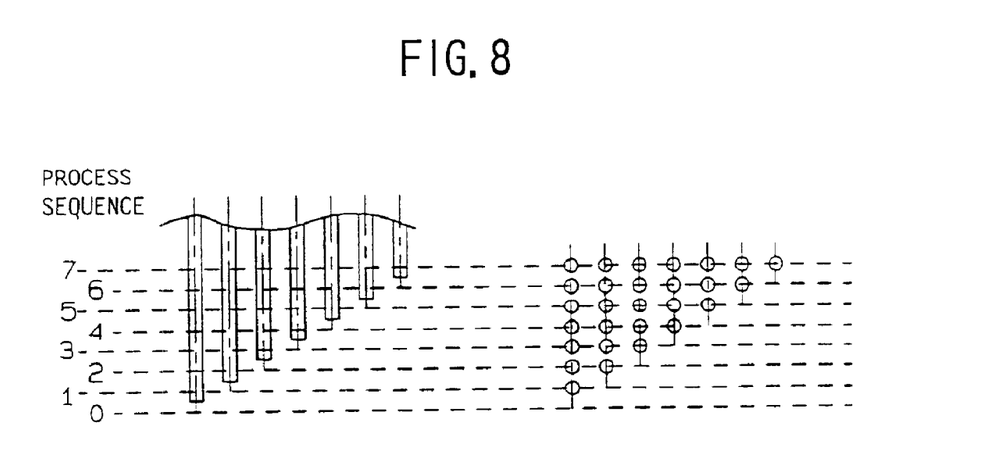
FIG. 8 is an illustration for explaining an example of a process performed by the press punching apparatus shown in FIG. 3.

FIG. 8 shows an example in which a number of through holes arranged in a row is sequentially changed. In FIG. 8, the left half indicates a length of each of the punches, that is, vertical position of each of the punches. The right half indicates positions of the thorough holes formed by the punches. Additionally, dotted lines suffixed with reference numerals indicate uppermost positions of the lower mold corresponding to the strokes sequentially changed in response to the reference numerals. The dotted lines in the right half indicate the rows of the through holes. For example, the dotted lines suffixed with the reference numeral "1" indicates the uppermost position of the lower mold in the first stroke and the position of the through holes formed in the first stroke.

In the example shown in FIG. 8, the substrate material is moved to the position indicated by the dotted line "1" where the punching is performed by the longest punch in the first stroke. Accordingly, a single through hole is formed in the first row. Then, the substrate material is moved to the position indicated by the dotted line "2" where the punching is performed by the second longest punch in the second stroke. Accordingly, two through holes are formed in the second row. Thereafter, the substrate material is moved to the position indicated by the dotted line "3" where the punching is performed by the third longest punch in the third stroke. Accordingly, three through holes are formed in the third row.

As mentioned above, the number of through holes can be increased by changing the uppermost position of the lower mold while sequentially moving the substrate material. Similarly, the number of through holes can be decreased by setting the upper most position of the lower mold to the position indicated by the doted line "7" at the initial state and sequentially lowering the uppermost position. Accordingly, a different number of through holes in a different row by changing the uppermost position of the lower mold in each stroke.

Figure 9:
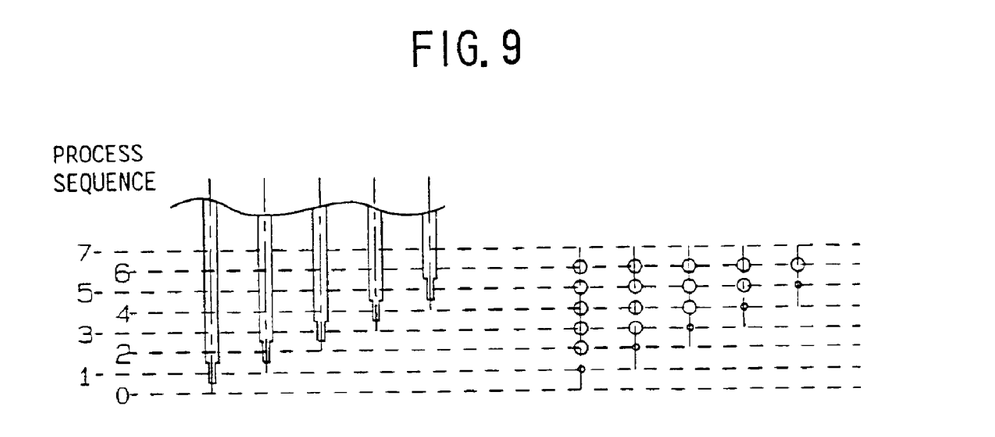
FIG. 9 is an illustration for explaining another example of a process performed by the press punching apparatus shown in FIG. 3.

The example shown in FIG. 9 is basically the same as that shown in FIG. 8 except for each of the punches being provided with a step at an end thereof so that through holes having different sizes can be formed in the same row. That is, the diameter of the through holes can be changed by providing a smaller diameter part at the end of each punch and adjusting the uppermost position of the lower mold. In the example of FIG. 9, the length of the smaller diameter part of each punch is equal to the distance of the stroke so as to form a single thorough hole having a smaller diameter in each row. However, the number of the smaller diameter through holes in each row can be increased by increasing the length of the smaller diameter part.

Figure 10:
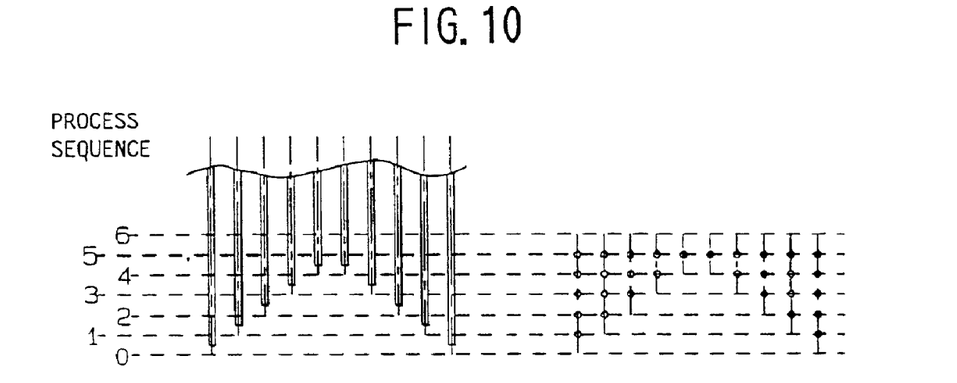
FIG. 10 is an illustration for explaining a further example of a process performed by the press punching apparatus shown in FIG. 3.

The example shown in FIG. 10 is also the same as that shown in FIG. 8 except for the number of punches being increased. In the example shown in FIG. 10, the lengths of the punches are varied in a bilaterally symmetric manner. Accordingly, the through holes can be arranged in a generally square area by performing a number of strokes which number is equal to the number of punches. It can be appreciated from FIG. 10 that the though holes arranged along a periphery of a square area as shown in FIG. 1 or FIG. 2 can be achieved by setting the lengths of the punches in the vicinity of the center equal to each other and setting the punches on the sides longer than the center punches.

Figure 11:
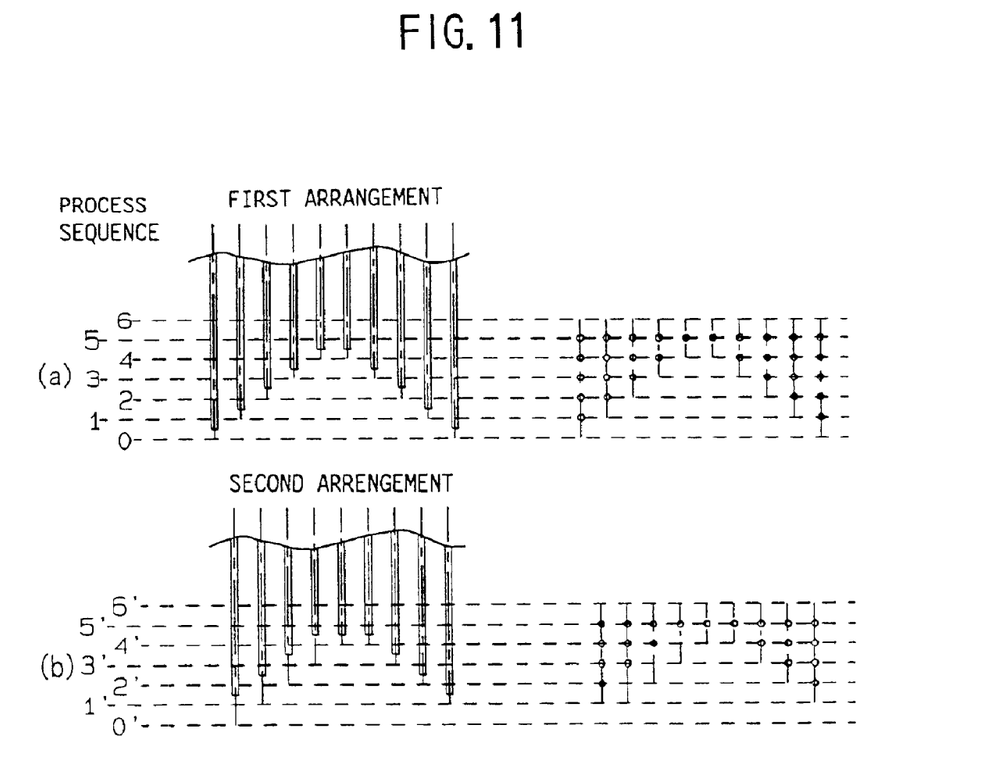
FIG. 11 is an illustration for explaining another example of a process performed by the press punching apparatus shown in FIG. 3.

In the example shown in FIG. 11, the punches are arranged in two rows. That is, a part of the punches are arranged in a first row as shown in FIG. 11-(a), and the rest of the punches are arranged in a second row as shown in FIG. 11-(b). The punches arranged in the second row as shown in FIG. 11-(b) are displaced from the respective punches arranged in the first row as shown in FIG. 11-(a) in the extending direction of rows by a distance equal to a half of the pitch of the punches of the first row.

Figure 12:
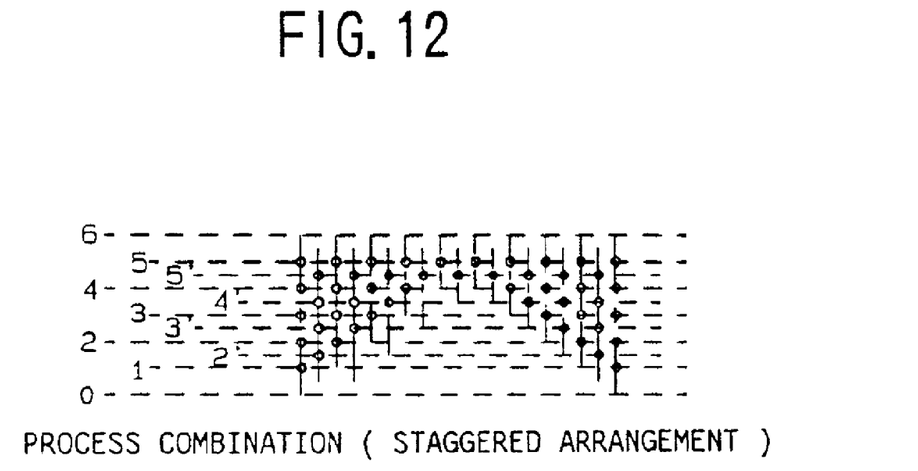
FIG. 12 is an illustration showing an arrangement of through holes obtained by the process shown in FIG. 11.
Figure 13:
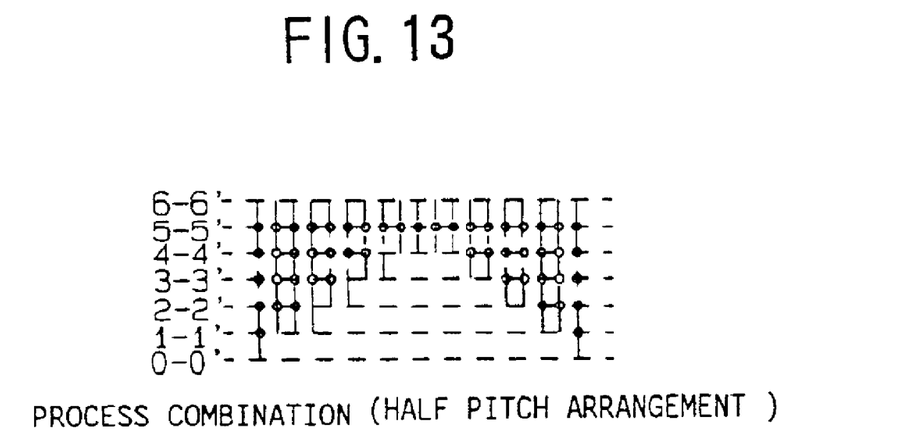
FIG. 13 is an illustration showing another arrangement of through holes obtained by the process shown in FIG. 11.

According to the punches arranged in two rows as shown in FIG. 11, through holes positioned in a staggered arrangement as shown in FIG. 12 can be formed by moving the substrate material to be punched by a distance equal to a half of the pitch of the punches for each stroke of the mold. Additionally, a pitch of the through holes in a row can be a half as shown in FIG. 13 by moving the substrate material to be punched by a distance equal to the pitch of the punches for each stroke of the mold.

It should be noted that although the lower mold 16 (die block) is vertically moved in the above-mentioned embodiment, the upper mold 12 (punch block) may be moved, or both may be moved. Additionally, the direction of movement of the mold is not limited to the vertical direction, and a horizontal direction may be adopted. If the horizontal direction is adopted, an inertial force due to a weight of the platen or the mold can be neglected, thereby increasing accuracy of positioning of the mold.

Additionally, although a single punch block having a plurality of punches arranged in a row is provided to the press punching apparatus according to the above-mentioned embodiment, a plurality of punch block may be provided so that variation of patterns of arrangement of the punched through holes may be achieved.

As mentioned above, various arrangement of through holes can be easily formed in a short time by using the press punching apparatus according to the present embodiment. Accordingly, by using the press punching apparatus according to the present invention, a plurality of through holes can be formed in a wiring board according to the present embodiment, which results in a reduction in a manufacturing cost of a semiconductor device. Additionally, if there is happen a case in which an arrangement of the thorough holes must changed, such a change may be achieved by varying a stroke of the mold or an amount of movement of the substrate material. Thus, there is no need to replace the entire mold including the punches and dies. Thereby, an investment in manufacturing semiconductor devices can be reduced, and an initial manufacturing period of semiconductor devices can be reduced.

What is claimed is:

1. A press punching method for forming a plurality of through holes in a planar work piece to be punched by an electrically controlled operation of a press, the press punching method comprising the steps of:
   placing the work piece in said press between a die block and at least one punch block having a plurality of punches arranged along a line, wherein distances between the ends of the punches and the die block are different from each other;
   forming at least one first through hole in the work piece by punching the work piece by a part of the punches by moving at least one of said die block and said punch block until a first predetermined distance is formed therebetween;
   controllably moving the work piece in a direction perpendicular to an extended direction of said line of punches by a predetermined distance after disengaging the part of the punches from the work piece by separating said die block and said punch block from each other;
   detecting a position of the moved die block or punch block at which said first through hole occurred and supplying a signal in response to said detected position for subsequently moving said at least one of said die block and said punch block; and
   forming at least one second through hole in the work piece by punching the work piece by a part of the punches by moving at least one of said die block and said punch block until a second predetermined distance, different from said first predetermined distance, is formed therebetween, to produce a selected pattern of through holes in the workpiece.

2. The press punching method as claimed in claim 1, wherein a plurality of punch blocks are provided so as to punch the work piece.

3. A press punching method for forming a plurality of through holes in a planar work piece to be punched by an electrically controlled operation of a press, the press punching method comprising the steps of:
   placing the work piece in said press between a die block and at least one punch block having a plurality of punches arranged along a line, wherein distances between the ends of the punches and the die block are different from each other;
   forming at least one first through hole in the work piece by punching the work piece by a part of the punches by moving at least one of said die block and said punch block until a first predetermined distance is formed therebetween;
   controllably moving the work piece linearly without rotation relative to the punch block and the die block in a direction perpendicular to an extended direction of said line of punches by a predetermined distance after disengaging the part of the punches from the work piece by separating said die block and said punch block from each other;
   detecting a position of the moved die block or punch block at which said first through hole occurred and supplying a signal in response to said detected position for subsequently moving said at least one of said die block and said punch block; and
   forming at least one second through hole in the work piece by punching the work piece by a part of the punches by moving at least one of said die block and said punch block until a second predetermined distance, different from said first predetermined distance, is formed therebetween, to produce a selected pattern of through holes in the workpiece.

4. A press punching method comprising the steps of: placing a workpiece in a press between a die block and a punch block of a mold; providing a row of linearly spaced punches of progressively graduated length in the punch block of the mold so that a first part of the punches penetrates a workpiece to be punched in a single stroke of the mold,
   moving the workpiece in a direction linearly without rotation relative to the punch block and the die block perpendicular to the row of the punches in synchronization with a stroke of the mold, and
   changing a travel distance of the mold in a different stroke so that a part of the punches other than said first part of the punches penetrates the workpiece to produce a selected pattern of penetrations in the workpiece.

* * * * *